(12) United States Patent
Kohda

(10) Patent No.: US 6,420,906 B1
(45) Date of Patent: Jul. 16, 2002

(54) FET-OR CIRCUIT AND POWER SUPPLY CIRCUIT USING THE SAME

(75) Inventor: Yoshimi Kohda, Tokyo (JP)

(73) Assignee: Allied Telesis Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/813,878

(22) Filed: Mar. 22, 2001

(30) Foreign Application Priority Data

Sep. 29, 2000 (JP) ........................................ 2000-298116

(51) Int. Cl.$^7$ ............................................. H03K 19/094
(52) U.S. Cl. ......................................... 326/114; 326/113
(58) Field of Search ................................ 326/112, 113, 326/114, 118, 124, 125

(56) References Cited

U.S. PATENT DOCUMENTS 4,622,648 A  * 11/1986  Whitaker ..................... 326/113
4,788,450 A     11/1988  Wagner
5,880,621 A  *  3/1999  Ohashi ........................ 326/113

FOREIGN PATENT DOCUMENTS

JP          3-243119     * 10/1991

* cited by examiner

*Primary Examiner*—Don Phu Le
(74) *Attorney, Agent, or Firm*—McGinn & Gibb, PLLC

(57) ABSTRACT

An OR circuit allowing one stable output voltage from a plurality of input voltages is disclosed. A first FET is connected between a corresponding input terminal and an output terminal in such a manner that an inherent diode of the FET is connected in a forward direction. A second FET is connected between a corresponding input terminal and the output terminal in the same manner as the first FET. Each of the input voltages is compared with the output voltage. The conduction/non-conduction states of each of the first and second FETs are independently controlled depending on the comparison result.

23 Claims, 3 Drawing Sheets

FET-OR CIRCUIT AND POWER SUPPLY CIRCUIT USING THE SAME

BACKGROUND OF THE INVENTION

1. Field of the Invention

The present invention relates to an OR circuit which produce an output voltage as an ORed voltage of plural input voltages.

2. Description of the Related Art

A diode-OR circuit has been broadly employed in not only digital circuits but also other electric circuits. For example, in a backup power supply circuit using a diode-OR circuit, cathodes of two diodes are connected in common to the output terminal, and main and backup power voltages are applied to respective anodes of the diodes. If the main power supply voltage is lowered for some cause, power is supplied from the backup power supply, resulting in a stable output voltage appearing on the common cathode side.

When a diode-OR circuit is used for connecting the load to the main and backup power supplies, a voltage drop inevitably occurs by a forward junction drop Vf (about 0.4 V to 0.8 V) depending on its diode type. Such a voltage drop is not ignorable in the case of a low-voltage power supply having a power voltage of 2.5 V or 3.3 V. Moreover, since the forward junction drop Vf varies depending on a current flowing through the diode, the diode-OR circuit also has a disadvantage that the output voltage varies depending on fluctuations of its load.

To overcome the above-described disadvantages, a backup power switch has been proposed in U.S. Pat. No. 4,788,450. This backup power switch uses two field-effect transistors (hereinafter abbreviated as FETs), each of which has an inherent diode as a so-called parasitic diode therein. In the backup power switch, a main power supply and a backup power supply (typically a battery) are connected to a load through respective ones of the two FETs, which are hereinafter called main-side FET and backup-side FET, respectively. The respective FETs are connected in such a way that the anode of each inherent diode is disposed on a corresponding power supply side and the cathode thereof is disposed on a load side. A control switch controls ON/OFF states of these FETs depending on the main power supply voltage. As is known well, an FET has little conduction resistance. Therefore, when the FET is brought to a conduction state, which causes its inherent diode to be short-circuited and equivalently removed from the circuit, the corresponding power supply voltage can appear on its output terminal as it is without any substantial voltage drop.

More specifically, the control switch monitors the main power supply voltage and, when the main power supply voltage falls into a predetermined proper range, sets the main-side FET to a conduction state and the backup-side FET to a non-conduction state (i.e., an inherent diode operating state). When the main power supply voltage becomes lower than the predetermined range, the control changes the main-side FET into non-conduction and the backup-side FET into conduction. Accordingly, even in the event of a main power failure, the power can be continuously supplied to the load from the backup power supply.

However, when detecting a drop of the main power supply voltage, the above-described backup power switch changes a power source from the main power supply to the backup power supply. This causes the following disadvantages.

1) The control switch monitors only the main power supply voltage and concurrently switches the respective main-side and backup-side FETs between conduction and non-conduction states depending on whether a drop of the main power supply voltage occurs. Therefore, there are cases where the voltage applied to the load is dropped instantaneously by some causes such as a time lag of the switching. In the case of an IC logical circuit, such an instantaneous voltage drop will cause an erroneous operation. Further, in the case of a reset IC incorporated therein, there is a possibility that the circuit is undesirably restarted.

2) The backup-side FET is normally in the non-conduction state where its inherent diode is in a reverse-biased state or in non-biased state and therefore the backup power supply operates unloaded without current flowing. When the main power supply voltage drops, the backup-side FET is brought into conduction, sharply increasing in load. To solve this problem, a switching power supply having a feedback circuit for keeping its output voltage constant is used as the backup power supply. In this case, however, since the feedback circuit of the switching power supply cannot follow up a rapid load fluctuation, the backup power voltage also sharply drops, inducing an erroneous operation.

SUMMARY OF THE INVENTION

An object of the present invention is to provide an inventive OR circuit allowing one stable output voltage to be produced from a plurality of input voltages.

Another object of the present invention is to provide a reliable power supply circuit which can supply a load with one stable power voltage produced from a plurality of power voltages.

According to the present invention, there is provided an OR circuit having a plurality of input terminals and a single output terminal, wherein a plurality of input voltages are applied to respective ones of the input terminals and an output voltage appears on the single output terminal. The OR circuit includes: a plurality of field-effect transistors provided for respective ones of the input terminals, each of the field-effect transistors connecting a corresponding input terminal to the single output terminal, wherein one major electrode of the field-effect transistor corresponding to an anode of an inherent diode of the field-effect transistor is connected to the corresponding input terminal and another major electrode of the field-effect transistor corresponding to a cathode of the inherent diode is connected to the single output terminal; and a plurality of controllers provided for respective ones of the field-effect transistors, wherein each of the controllers brings a corresponding field-effect transistor into a selected one of conduction state and non-conduction state depending on which one of a corresponding input voltage and the output voltage is higher than the other.

Preferably, each of the controllers brings a corresponding field-effect transistor into conduction when the output voltage is equal to or lower than a corresponding input voltage, and brings the corresponding field-effect transistor into non-conduction when the output voltage is higher than a corresponding input voltage.

According to an embodiment of the present invention, there is provided a power supply circuit using a plurality of power supplies to generate a single output voltage which is supplied to a load. The power supply circuit includes: a plurality of p-channel field-effect transistors provided for respective ones of the power supplies, each of the p-channel field-effect transistors connecting a corresponding power supply to the load, wherein a drain electrode of the p-channel field-effect transistor corresponding to an anode of an inherent diode of the p-channel field-effect transistor is connected to the corresponding power supply and a source electrode of the p-channel field-effect transistor corresponding to a cathode of the inherent diode is connected to the load; and a plurality of voltage comparators provided for respective ones of the power supplies, wherein each of the voltage comparators brings a corresponding p-channel field-effect transistor into a selected one of conduction state and non-conduction state depending on which one of a corresponding power supply voltage and the single output voltage is higher than the other.

According to another embodiment of the present invention, there is provided a power supply circuit using a plurality of power supplies to generate a single output voltage which is supplied to a load. The power supply circuit includes: a plurality of n-channel field-effect transistors provided for respective ones of the power supplies, each of the n-channel field-effect transistors connecting a corresponding power supply to the load, wherein a source electrode of the n-channel field-effect transistor corresponding to an anode of an inherent diode of the n-channel field-effect transistor is connected to the corresponding power supply and a drain electrode of the n-channel field-effect transistor corresponding to a cathode of the inherent diode is connected to the load; and a plurality of voltage comparators provided for respective ones of the power supplies, wherein each of the voltage comparators brings a corresponding n-channel field-effect transistor into a selected one of conduction state and non-conduction state depending on which one of a corresponding power supply voltage and the single output voltage is higher than the other.

According to another aspect of the present invention, there is provided a control method of an OR circuit having a plurality of input terminals and a single output terminal, wherein a plurality of input voltages are applied to respective ones of the input terminals and an output voltage appears on the single output terminal, the OR circuit comprising a plurality of field-effect transistors provided for respective ones of the input terminals, each of the field-effect transistors connecting a corresponding input terminal to the single output terminal, wherein one major electrode of the field-effect transistor corresponding to an anode of an inherent diode of the field-effect transistor is connected to the corresponding input terminal and another major electrode of the field-effect transistor corresponding to a cathode of the inherent diode is connected to the single output terminal. The method includes the steps of: a) comparing each of the input voltages with the output voltage; and b) setting a field-effect transistor corresponding to the input voltage to a selected one of conduction state and non-conduction state depending on a result of the comparing step (a).

Preferably, the step (b) includes steps of: setting the corresponding field-effect transistor to the conduction state when the output voltage is equal to or lower than the corresponding input voltage; and setting the corresponding field-effect transistor to the non-conduction state when the output voltage is higher than the input voltage.

As described above, according to the present invention, in each of a plurality of field-effect transistors, a corresponding input voltage is compared with the output voltage, and the conduction/non-conduction state of a corresponding field-effect transistor is controlled depending on a corresponding comparison result. Therefore, the conduction/non-conduction states of the respective field-effect transistors are individually controlled and all the field-effect transistors are not uniformly controlled. This can effectively avoid a sharp change of the output voltage. As a result, the output voltage can be kept in a remarkably stable state.

DETAILED DESCRIPTION OF THE PREFERRED EMBODIMENTS

Figure 1:
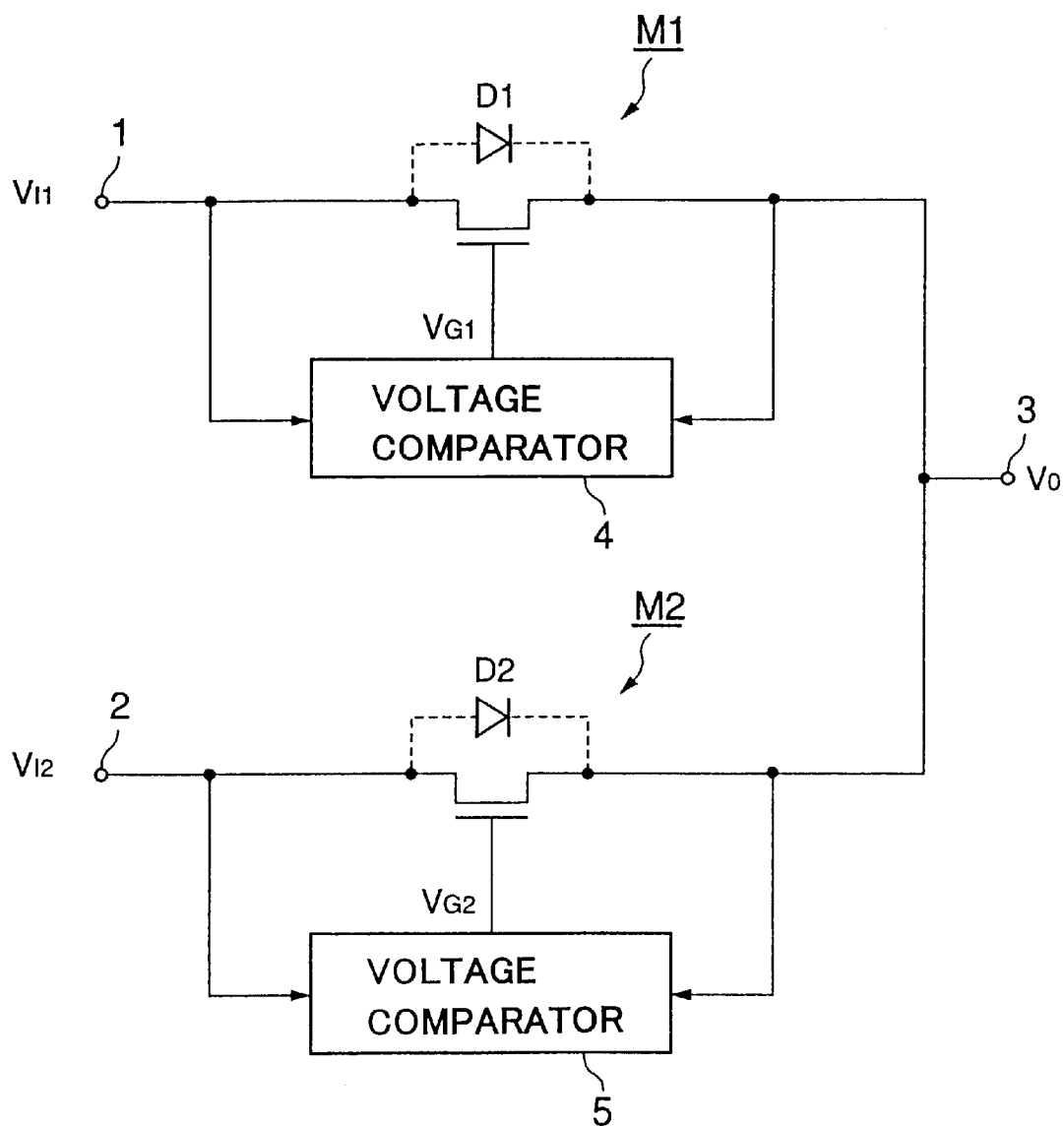
FIG. 1 is a schematic block diagram showing an OR circuit according to an embodiment of the present invention.

Referring to FIG. 1, an OR circuit according to an embodiment of the present invention has two input terminals 1 and 2, and one output terminal 3. DC (Direct-Current) input voltages $V_{11}$ and $V_{12}$ are applied to respective ones of the input terminals 1 and 2, and a DC output voltage Vo appears on the output terminal 3 as an OR of the input voltages $V_{11}$ and $V_{12}$.

The input terminal 1 is connected to the output terminal 3 of the OR circuit via a field-effect transistor M1 and further a voltage comparator 4 is provided for the field-effect transistor M1. Furthermore, the input terminal 2 is connected to the output terminal 3 via a field-effect transistor M2 and further a voltage comparator 5 is provided for the field-effect transistor M2. As described before, the field-effect transistors M1 and M2 include inherent junction diodes D1 and D1, respectively.

The voltage comparator 4 compares a voltage on the input-side main electrode of the field-effect transistor M1 (i.e. the input voltage $V_{11}$) with a voltage on the output-side main electrode thereof (i.e., the output voltage Vo). The voltage comparator 4 controls a gate voltage $V_{G1}$ applied to the gate of the field-effect transistor M1 in such a manner that the field-effect transistor M1 is brought into conduction or non-conduction depending on the comparison result. The details will be described later.

Similarly, the voltage comparator 5 compares a voltage on the input-side main electrode of the field-effect transistor M2 (i.e. the input voltage $V_{12}$) with a voltage on the output-side main electrode thereof (i.e., the output voltage Vo). The voltage comparator 5 controls a gate voltage $V_{G2}$ applied to the gate of the field-effect transistor M2 in such a manner that the field-effect transistor M2 is brought into conduction or non-conduction depending on the comparison result. The details will be described later.

The field-effect transistors M1 and M2 may be of either a p-channel type or an n-channel type, but need to be connected in such a manner that the anode of each inherent diode is directed to a corresponding input terminal, and the cathode thereof is directed to the output terminal 3. The input voltage $V_{11}$ may be the same as or different from the input voltage $V_{12}$.

In the case where the input voltage $V_{11}$ is different from $V_{12}$ and these voltages are normally inputted, a higher one of these voltages appears as the output voltage Vo on the output terminal 3. For example, with $V_{11} > V_{12}$, the voltage comparator 4 sets the gate voltage $V_{G1}$ so as to bring the field-effect transistor M1 into conduction. In other words, the inherent diode D1 is short-circuited and does not function. Since the conduction resistance of a field-effect transistor is very low, the input voltage $V_{11}$ appears on the output terminal 3 without any substantial voltage drop.

In this state, since the output voltage Vo is substantially $V_{11}$ (>$V_{12}$), the other voltage comparator 5 sets the gate voltage $V_{G2}$ so as to bring the field-effect transistor M2 into non-conduction. Therefore, in the field-effect transistor M2, the inherent diode D2 is reverse-biased.

Consider the case where the input voltage $V_{11}$ drops for some reason in the above operation status. When a drop of the input voltage $V_{11}$ causes the output voltage Vo to drop to the input voltage $V_{12}$, the voltage comparator 5 changes the gate voltage $V_{G2}$ so as to bring the field-effect transistor M2 into conduction. This causes the inherent diode D2 to be short-circuited and not to function. When the field-effect transistor M2 is in the conduction state, the input voltage $V_{12}$ appears on the output terminal 3 without any substantial voltage drop. Therefore, the output voltage Vo smoothly drops from the voltage $V_{11}$ to the voltage $V_{12}$, and is stabilized. A rapid voltage change that would be caused by a conventional switching operation can be avoided.

When the input voltage $V_{11}$ has restored in this backup state, the voltage comparator 4 sets the gate voltage $V_{G1}$ so as to bring the field-effect transistor M1 into conduction, the output voltage Vo substantially returns to $V_{11}$, and the other voltage comparator 5 sets the gate voltage $V_{G2}$ so as to bring the field-effect transistor M2 into non-conduction. Thereby, in the field-effect transistor M2, the inherent diode D2 is reverse-biased.

Moreover, in the case where the input voltage $V_{11}$ is the same as the input voltage $V_{12}$, the field-effect transistors M1 and M2 are both set to the conduction state, and the input voltage can be always supplied to the output terminal. In this state, when one input voltage drops, a field-effect transistor corresponding to the dropped input voltage is forced into the non-conduction state as described above, that is, the corresponding field-effect transistor is set to an inherent diode function state. Additionally, the output voltage is kept by the other field-effect transistor being in the conduction state. Therefore, even when either input voltage drops, the output voltage does not drop.

As described above, in each of the plurality of field-effect transistors, the input voltage is compared with the output voltage, and the conduction/non-conduction state of a corresponding field-effect transistor is controlled depending on the comparison result. This can therefore avoid an undesired change of the output voltage caused by concurrent switching of all the field-effect transistors. As a result, the output voltage Vo appearing on the output terminal 3 can be kept in a remarkably stable state.

In the above-described embodiment, to simplify the description, the two-inputs one-output OR circuit has been illustrated. Needless to say, even a plural-inputs OR circuit can similarly be constituted by connecting a field-effect transistor and a voltage comparator for each input as shown in FIG. 1.

EXAMPLE I

Figure 2:
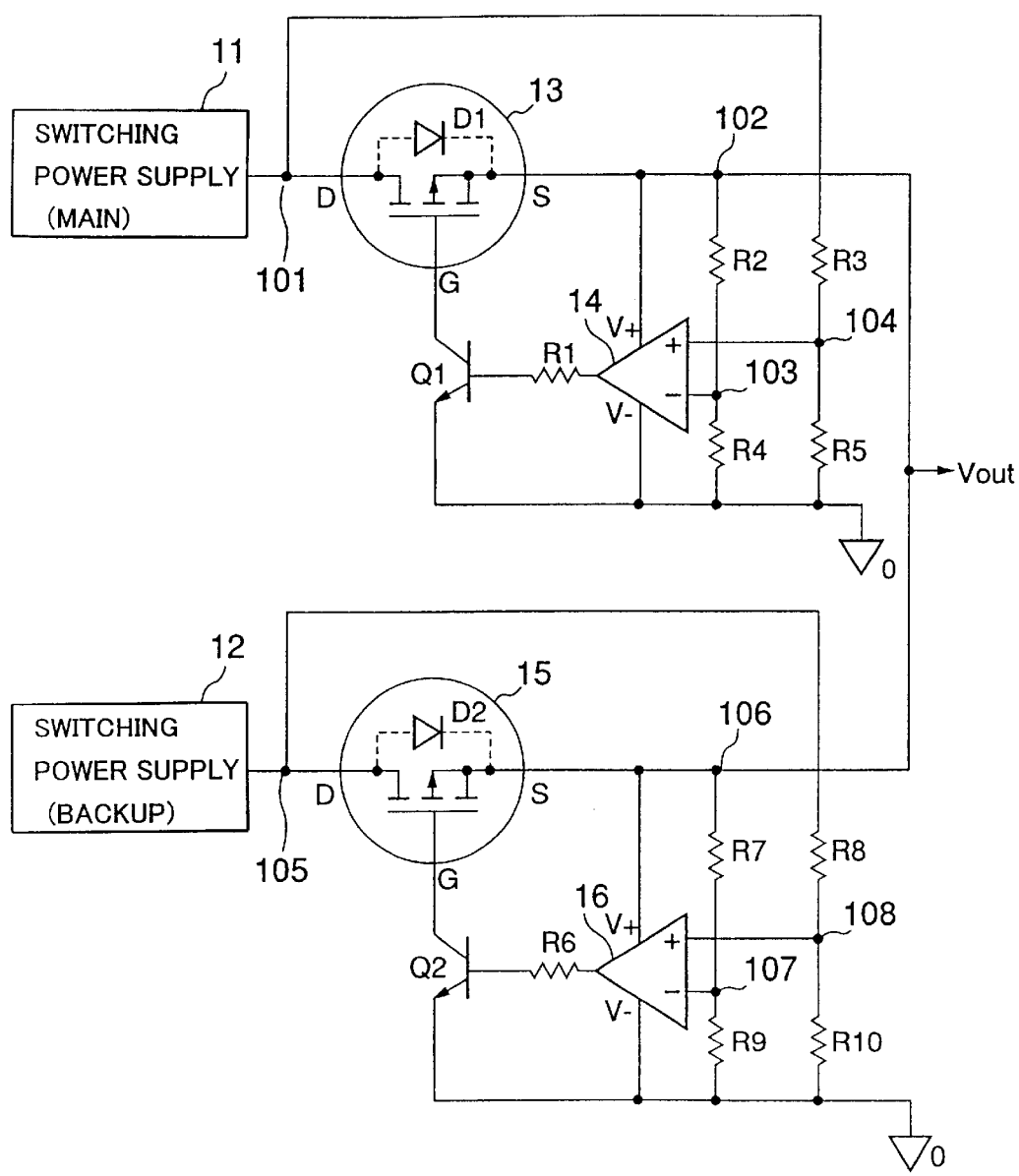
FIG. 2 is a circuit diagram showing an example of a redundant power supply circuit with an OR circuit using a p-channel field-effect transistor (FET) according to the embodiment of the present invention.

Referring to FIG. 2, a switching power supply 11 is used as a main power supply, and a switching power supply 12 is used as a backup or sub power supply. Either one of the switching power supplies is a stabilized power supply having a feedback circuit for keeping its output voltage constant.

A main power supply system is constituted of a p-channel FET (field-effect transistor) 13, a comparator 14 composed of an operational amplifier, a transistor Q1, and resistors R1 to R5. Here, the p-channel FET 13 corresponds to the field-effect transistor M1 of FIG. 1, and a combination of the comparator 14, transistor Q1 and resistors R1 to R5 corresponds to the voltage comparator 4 of FIG. 1.

Similarly, a backup power supply system is constituted of a p-channel FET 15, a comparator 16 of an operational amplifier, a transistor Q2, and resistors R6 to R10. Here, the p-channel FET 15 corresponds to the field-effect transistor M2 of FIG. 1, and a combination of the operation amplifier comparator 16, transistor Q2 and resistors R6 to R10 corresponds to the voltage comparator 5 of FIG. 1.

More specifically, the output terminal of the switching power supply 11 is connected to a drain electrode of the FET 13, which is further grounded via the resistors R3 and R5 connected in series. Accordingly, a circuit from the output terminal of the switching power supply 11 to a reference line (grounding line) through the resistors R3 and R5 is closed. A source electrode of the FET 13 is connected to the output terminal of the power supply circuit, which is further grounded via the resistors R2 and R4 connected in series. In this case, the inherent diode D1 exists between drain and source of the FET 13 as shown in FIG. 2. The anode of the inherent diode D1 is equivalently connected to the output terminal of the switching power supply 11, and the cathode thereof is equivalently connected to the output terminal of the power supply circuit.

A connection point 103 of the resistors R2 and R4 is connected to an inverting input terminal of the comparator 14, and an output voltage Vout can be monitored based on a divided voltage at the connection point 103. A connection point 104 of the resistors R3 and R5 is connected to a non-inverting input terminal of the comparator 14, and the input voltage from the switching power supply 11 can be monitored based on a divided voltage at the connection point 104.

The output terminal of the comparator 14 is connected to a base electrode of the transistor Q1 via the resistor R1. A collector electrode of the transistor Q1 is connected to a gate electrode of the FET 13, and an emitter terminal thereof is grounded. The comparator 14 is supplied with power from the source electrode of the FET 13, that is, the output voltage Vout.

In the above-described circuit, in the case of setting the resistors R2 to R5 to appropriate resistance values, the comparator 14 outputs a high level when the output voltage Vout is equal to or lower than the input voltage, which brings the transistor Q1 into conduction. When the transistor Q1 is in conduction state, the gate voltage of the FET 13 is set to the ground potential. This brings the FET 13 into conduction. On the other hand, when the output voltage Vout is higher than the input voltage, the comparator 14 outputs a low level, which brings the transistor Q1 into non-conduction. Therefore, the FET 13 is brought into non-conduction (i.e., in an inherent diode function state). The basic operation thereof is as described in FIG. 1.

Similarly, the output terminal of the switching power supply 12 is connected to the drain electrode of the FET 15, which is further grounded via the resistors R8 and R10 connected in series. Therefore, a circuit from the output terminal of the switching power supply 12 to the reference line (grounding line) through the resistors R8 and R10 is closed. The source electrode of the FET 15 is connected to the output terminal of the power supply circuit, which is further grounded via the resistors R7 and R9 connected in series. Additionally, the inherent diode D2 exists between drain and source in the FET 15. The anode of the inherent diode D2 is equivalently connected to the output terminal of the switching power supply 12, and the cathode thereof is equivalently connected to the output terminal of the power supply circuit.

A connection point 107 of the resistors R7 and R9 is connected to the inverting input terminal of the comparator 16, and a connection point 108 of the resistors R8 and R10 is connected to the non-inverting input terminal of the comparator 15. The output terminal of the comparator 16 is connected to the base electrode of the transistor Q2 via the resistor R6. The collector electrode of the transistor Q2 is connected to the gate electrode of the FET 15, and the emitter electrode thereof is grounded. The comparator 16 is supplied with power from the output voltage on the source electrode of the FET 15. Since an operation of the backup power supply system is the same as that of the main power supply system, the description thereof is omitted.

EXAMPLE II

Figure 3:
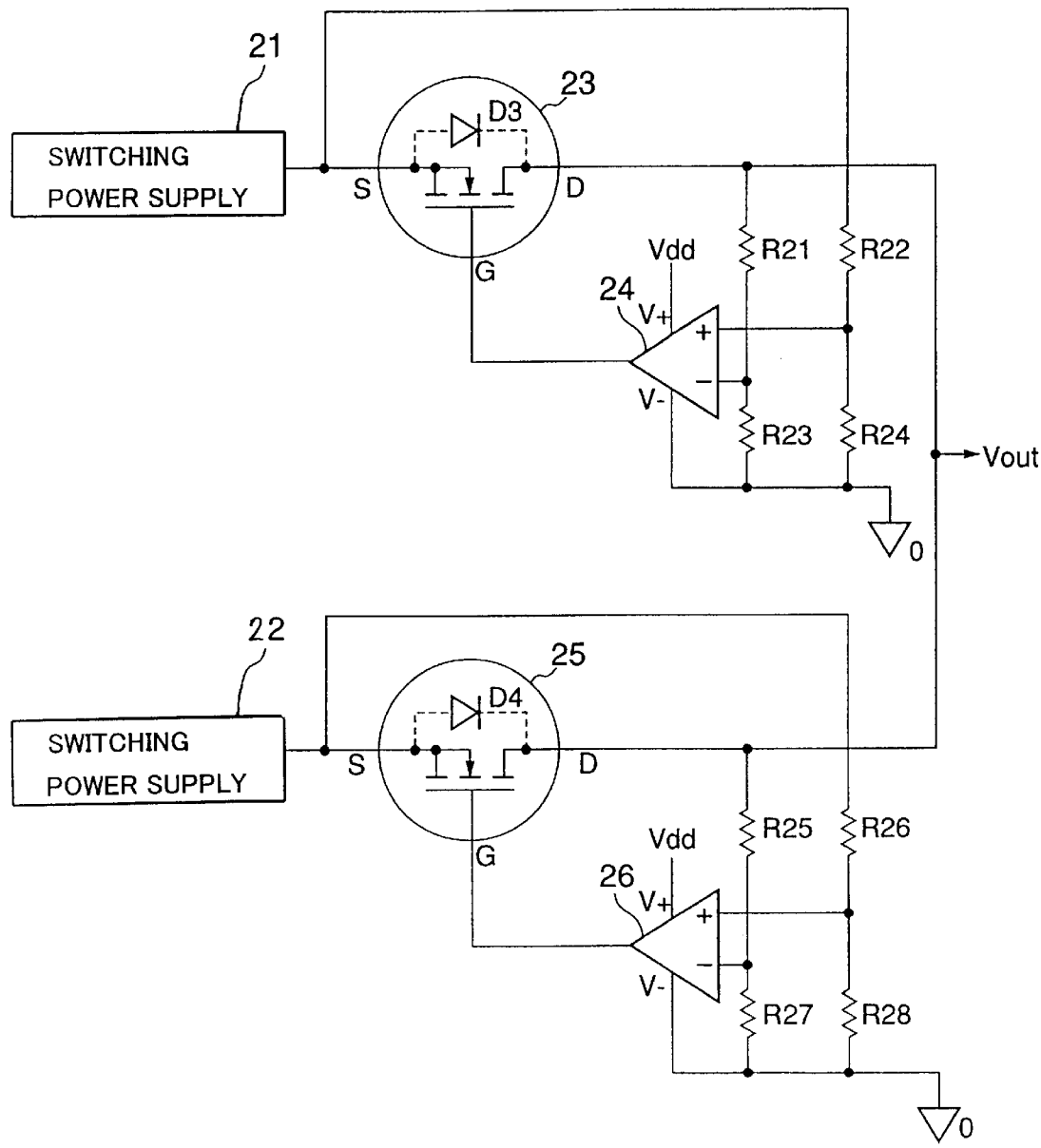
FIG. 3 is a circuit diagram showing another example of the redundant power supply circuit with an OR circuit using an n-channel FET according to the embodiment of the present invention.

Referring to FIG. 3, a switching power supply 21 is used as the main power supply, and a switching power supply 22 is used as the backup power supply. Either one of the switching power supplies is a stabilized power supply having a feedback circuit for keeping the output voltage constant.

The main power supply system is constituted of an n-channel FET 23, a comparator 24 of an operational amplifier, and resistors R21 to R24. Here, the n-channel FET 23 corresponds to the field-effect transistor M1 of FIG. 1, and a combination of the comparator 24 and resistors R21 to R24 corresponds to the voltage comparator 4 of FIG. 1.

Similarly, the backup power supply system is constituted of an n-channel FET 25, a comparator 26 of an operational amplifier, and resistors R25 to R28. Here, the n-channel FET 25 corresponds to the field-effect transistor M2 of FIG. 1, and a combination of the comparator 26 and resistors R25 to R28 corresponds to the voltage comparator 5 of FIG. 1.

More specifically, the output terminal of the switching power supply 21 is connected to the source electrode of the FET 23, and further grounded via the resistors R22 and R24 connected in series. Therefore, a circuit from the output terminal of the switching power supply 21 to the reference line (grounding line) through the resistors R22 and R24 is closed. The drain electrode of the FET 23 is connected to the output terminal of the power supply circuit, and further grounded via the resistors R21 and R23 connected in series. Additionally, an inherent diode D3 exists between drain and source in the FET 23. The anode of the inherent diode D3 is connected to the output terminal of the switching power supply 21, and the cathode thereof is connected to the output terminal of the power supply circuit.

A connection point of the resistors R21 and R23 is connected to the inverting input terminal of the comparator 24. The output voltage Vout can be monitored by detecting a voltage at the connection point of the resistors R21 and R23. A connection point of the resistors R22 and R24 is connected to the non-inverting input terminal of the comparator 24. The input voltage from the switching power supply 21 can be monitored by detecting a voltage at the connection point of the resistors R22 and R24. The output terminal of the comparator 24 is connected to the gate electrode of the FET 23. Additionally, the comparator 24 is supplied with power from another power supply Vdd.

In the above-described circuit, when the resistors R21 to R24 are set to appropriate resistance values, the comparator 24 outputs a high level when the output voltage Vout is substantially equal to or lower than the input voltage, which brings the FET 23 into conduction. On the other hand, when the output voltage Vout is higher than the input voltage, the comparator 24 outputs a low level, which brings the FET 23 into non-conduction and therefore causes the inherent diode D3 to function. The basic operation thereof is similar to as described in FIG. 1.

Similarly, the output terminal of the switching power supply 22 is connected to the source electrode of the FET 25, and further grounded via the resistors R26 and R28 connected in series. Therefore, a circuit from the output terminal of the switching power supply 22 to the reference line (grounding line) through the resistors R26 and R28 is closed. The drain electrode of the FET 25 is connected to the output terminal of the power supply circuit, and further grounded via the resistors R25 and R27 connected in series. Additionally, an inherent diode D4 exists between drain and source in the FET 25. The anode of the inherent diode D4 is equivalently connected to the output terminal of the switching power supply 21, and the cathode thereof is equivalently connected to the output terminal of the power supply circuit.

A connection point of the resistors R25 and R27 is connected to the inverting input terminal of the comparator 26, and the output voltage Vout is monitored by detecting a voltage at the connection point of the resistors R25 and R27. A connection point of the resistors R26 and R28 is connected to the non-inverting input terminal of the comparator 26, and the input voltage from the switching power supply 22 is monitored by detecting a voltage at the connection point of the resistors R26 and R28. The output terminal of the comparator 26 is connected to the gate electrode of the FET 25.

Therefore, when the resistors R25 to R28 are set to appropriate resistance values, the comparator 26 outputs a high level when the output voltage Vout is substantially equal to or lower than the input voltage, which brings the FET 25 into conduction. On the other hand, when the output voltage Vout is higher than the input voltage, the comparator 26 outputs a low level, which brings the FET 25 into non-conduction and therefore causes the inherent diode D4 to function. Since the basic operation is similar to that of the main power supply system, the details thereof is omitted.

As described above, in the redundant power supply circuit constituted as described in the first and second examples, in the event of the main power supply voltage dropping, the output voltage Vout smoothly shifts from the main switching power voltage to the sub switching power voltage. Accordingly, a sharply decrease in voltage can be effectively avoided.

Moreover, when the main switching power voltage is equal to the sub switching power voltage, both of the field-effect transistors are in the conduction state, and the input voltage can constantly be supplied to the load through the output terminal. When one switching power voltage drops in this state, as described above, the corresponding field-effect transistor is forced into non-conduction, and the output voltage is kept by the other field-effect transistor. Therefore, even when one of the switching power voltages drops, the output voltage Vout can be kept at the predetermined voltage.

As described above, a combination of a field-effect transistor and a voltage comparator is provided for each of a plurality of switching power supplies. Each switching power voltage is compared with the output voltage, and the conduction/non-conduction state of a corresponding field-effect transistor is controlled depending on a corresponding comparison result. Therefore, as a result, the output voltage Vout appearing on the output terminal is stabilized without any sharp or instantaneous drop.

In the first and second embodiments, to simplify the description thereof, the redundant system using two switching power supplies has been illustrated, but a similar constitution can be realized using three or more switching power supplies.

As described above in detail, according to the present invention, in each of the plurality of field-effect transistors, a corresponding input voltage is compared with the output voltage, and the conduction/non-conduction state of a corresponding field-effect transistor is controlled based on a corresponding comparison result. Therefore, the conduction/non-conduction states of the respective field-effect transistors are individually controlled and all the field-effect transistors are not uniformly controlled. This can effectively avoid a sharp change of the output voltage. As a result, the output voltage can be kept in a remarkably stable state.

What is claimed is:

1. An OR circuit having a plurality of input terminals and a single output terminal, wherein a plurality of input voltages are applied to respective ones of the input terminals and an output voltage appears on the single output terminal, the OR circuit comprising:

a plurality of controllers provided for respective ones of the input terminals, each of the field-effect connecting a corresponding input terminal to the single output terminal, wherein one major electrode of the field-effect transistor corresponding to an anode of an inherent diode of the field-effect transistor is connected to the corresponding input terminal and another major electrode of the field-effect transistor corresponding to a cathode of the inherent diode is connected to the single output terminal; and a plurality of controllers provided for respective ones of the field-effect wherein each of the controllers brings a corresponding field-effect transistor into a selected one of conduction state and non-conduction state depending on which one of a corresponding input voltage and the out voltage is higher than the other, each controller comprising an operational amplifier having a positive input signal controlled by a voltage from said electrode corresponding to an anode of the inherent diode and a negative input signal controlled by a voltage from said electrode corresponding to a cathode of the inherent diode.

2. The OR circuit according to claim 1, wherein each of the controllers brings a corresponding field-effect transistor into conduction when the output voltage is equal to or lower than a corresponding input voltage, and brings the corresponding field-effect transistor into non-conduction when the output voltage is higher than a corresponding input voltage.

3. The OR circuit according to claim 1, wherein each of the field-effect transistors is a p-channel field-effect transistor.

4. The OR circuit according to claim 1, wherein each of the controllers is supplied with power from the output voltage.

5. The OR circuit according to claim 1, wherein each of the field-effect transistors is an n-channel field-effect transistor.

6. An OR circuit having a plurality of input terminals and a single output terminal, wherein a plurality of input voltages are applied to respective ones of the input terminals and an output voltage appears on the single output terminal, the OR circuit comprising:

a plurality of field-effect transistors provided for respective ones of the input terminals, each of the field-effect transistors connecting a corresponding input terminal to the single output terminal, wherein one major electrode of the field-effect transistor corresponding to an anode of an inherent diode of the field-effect transistor is connected to the corresponding input terminal and another major electrode of the field-effect transistor corresponding to a cathode of the inherent diode is connected to the single output terminal; and a plurality of controllers provided for respective ones of the field-effect transistors, wherein each of the controllers brings a corresponding field-effect transistor into a selected one of conduction state and non-conduction state depending on which one of a corresponding input voltage and the output voltage is higher than the other, wherein each of the controllers comprises:

a first voltage divider for dividing a corresponding input voltage to produce a first voltage;

a second voltage divider for dividing the output voltage to produce a second voltage; and a comparator for comparing the first voltage with the second voltage to produce a control voltage, wherein the control voltage is applied to a control electrode of the corresponding field-effect transistor.

7. An OR circuit having a plurality of input terminals and a single output terminal, wherein a plurality of input voltages are applied to respective ones of the input terminals and an output voltage appears on the single output terminal, the OR circuit comprising:

a plurality of field-effect transistors provided for respective ones of the input terminals, each of the field-effect transistors connecting a corresponding input terminal to the single output terminal, wherein one major electrode of the field-effect transistor corresponding to an anode of an inherent diode of the field-effect transistor is connected to the corresponding input terminal and another major electrode of the field-effect transistor corresponding to a cathode of the inherent diode is connected to the single output terminal; and a plurality of controllers provided for respective ones of the field-effect transistors, wherein each of the controllers brings a corresponding field-effect transistor into a selected one of conduction state and non-conduction state depending on which one of a corresponding input voltage and the output voltage is higher than the other, wherein each of the controllers is supplied with power from a power supply other than the corresponding input voltage and the output voltage.

8. A power supply circuit using a plurality of power supplies to generate a single output voltage which is supplied to a load, comprising:

a plurality of p-channel field-effect transistors provided for respective ones of the power supplies, each of the p-channel field-effect transistors connecting a corresponding power supply to the load, wherein a drain electrode of the p-channel field-effect transistor corresponding to an anode of an inherent diode of the p-channel field-effect transistor is connected to the corresponding power supply and a source electrode of the p-channel field-effect transistor corresponding to a cathode of the inherent diode is connected to the load, and a plurality of voltage comparators provided for respective ones of the power supplies, wherein each of the voltage comparators brings a corresponding p-channel field-effect transistor into a selected one of conduction state and non-conduction state depending on which one of a corresponding power supply voltage and the single output voltage is higher than the other, each voltage comparator comprising an operational amplifier having a positive input signal controlled by a voltage from said electrode corresponding to an anode of the inherent diode and a negative input signal controlled by a voltage from said electrode corresponding to a cathode of the inherent diode.

9. The power supply circuit according to claim 8, wherein each of the voltage comparators brings a corresponding p-channel field-effect transistor into conduction when the single output voltage is equal to or lower than a corresponding power supply voltage.

10. The power supply circuit according to claim 8, wherein each of the power supplies is a stabilized power supply.

11. The power supply circuit according to claim 8, wherein the load is a logical circuit formed of an integrated circuit.

12. A power supply circuit using a plurality of power supplies to generate a single output voltage which is supplied to a load, comprising:
   a plurality of p-channel field-effect transistors provided for respective ones of the power supplies, each of the p-channel field-effect transistor connecting a corresponding power supplies, to the load, wherein a drain electrode of the p-channel field-effect transistor corresponding to an anode of an inherent diode of the p-channel field-effect transistor is connected to the corresponding power supply and a source electrode of the p-channel field-effect transistor corresponding to a cathode of the inherent diode is connected to the load; and
   a plurality of voltage comparators provided for respective ones of the power supplies, wherein each of the voltage comparators brings a corresponding p-channel field-effect transistor into a selected one of conduction state and non-conduction state depending on which one of a corresponding power supply voltage and the single output voltage is higher than the other, wherein each of the voltage comparator comprises:
      a first voltage divider for dividing a corresponding power supply voltage to produce a first voltage;
      a second voltage divider for dividing the output voltage to produce a second voltage; and
      a comparator for comparing the first voltage with the second voltage to output a conduction/non-conduction control voltage to a control electrode of the corresponding p-channel field-effect transistor.

13. A power supply circuit using a plurality of power supplies to generate a single output voltage which is supplied to a load, comprising:
   a plurality of n-channel field-effect transistors provided for respective ones of the power supplies, each of the n-channel field-effect transistors connecting a corresponding power supply to the load, wherein a source electrode of the n-channel field-effect transistor corresponding to an anode of an inherent diode of the n-channel field-effect transistor is connected to the corresponding power supply and a drain electrode of the n-channel field-effect transistor corresponding to a cathode of the inherent diode is connected to the load; and
   a plurality of voltage comparators provided for respective ones of the power supplies, wherein each of the voltage comparators brings a corresponding n-channel field-effect transistor into a selected one of conduction sated and non-conduction state depending on which one of a corresponding power supply voltage and the single output voltage is higher than the other, wherein each of the voltage comparators comprises:
      a first voltage divider for dividing a corresponding power supply voltage to produce a first voltage;
      a second voltage divider for dividing the output voltage to produce a second voltage; and
      a comparator for comparing the first voltage with the second voltage to output a conduction/non-conduction control voltage to a control electrode of the correspond n-channel field-effect transistor.

14. A power supply circuit using a plurality of power supplies to generate a single output voltage which is supplied to a load, comprising:
   a plurality of n-channel field-effect transistors provided for respective ones of the power supplies, each of the n-channel field-effect transistors connecting a corresponding power supply to the load, wherein a source electrode of the n-channel field-effect transistor corresponding to an anode of an inherent diode of the n-channel field-effect transistor is connected to the corresponding power supply and a drain electrode of the n-channel field-effect transistor corresponding to a cathode of the inherent diode is connected to the load; and
   a plurality of voltage comparators provided for respective ones of the power supplies, wherein each of the voltage comparators brings a corresponding n-channel field-effect transistor into a selected one of conduction state and non-conduction state depending on which one of a corresponding power supply voltage and the single output voltage is higher than the other.

15. The power supply circuit according to claim 14, wherein each of the power supplies is a stabilized power supply.

16. The power supply circuit according to claim 14, wherein each of the voltage comparators brings a corresponding n-channel field-effect transistor into conduction when the single output voltage is equal to or lower than a corresponding power supply voltage.

17. The power supply circuit according to claim 14, wherein the load is a logical circuit formed of an integrated circuit.

18. A control method of an OR circuit having a plurality of input terminals and a single output terminal, wherein a plurality of input voltages are applied to respective ones of input terminals and an output voltage appears on the single output terminal, the OR circuit comprising a plurality of field-effect transistors provided for respective ones of the input terminals, each of the field-effect transistors connecting a corresponding input terminal to the single output terminal, wherein one major electrode of the field-effect transistor corresponding to an anode of an inherent diode of the field-effect transistor is connected to the corresponding input terminal and another major electrode of the field-effect transistor corresponding to a cathode of the inherent diode is connected to the single output terminal, each of the field-effect transistors controlled by an operational amplifier having a positive input signal derived from a voltage of the major electrode corresponding to an anode and a negative input signal derived from a voltage of the major electrode corresponding to a cathode, the method comprising:
   comparing each of the input voltages with the output voltage; and
   setting a field-effect transistor corresponding to the input voltage to a selected one of conduction state and non-conduction state depending on a result of the comparing.

19. The method according to claim 18, wherein the setting to a selected state comprises:
   setting the corresponding field-effect transistor to the conduction state when the output voltage is equal to or lower than the corresponding input voltage, and
   setting the corresponding field-effect transistor to the non-conduction state when the output voltage is higher than the input voltage.

20. A control method of a power supply circuit using a plurality of power supplies to generate a single output voltage which is supplied to a load, the power supply circuit comprising a plurality of p-channel field-effect transistors provided for respective ones of the power supplies, each of the p-channel field-effect transistors connecting a corresponding power supply to the load, wherein a drain electrode of the p-channel field-effect transistor corresponding to an anode of an inherent diode of the p-channel field-effect transistor is connected to the corresponding power supply and a source electrode of the p-channel field-effect transistor corresponding to a cathode of the inherent diode is connected to the load, each of the p-channel field-effect transistors controlled by an operational amplifier having a positive signal input derived from a voltage at the drain electrode and a negative signal input derived from a voltage at the source electrode, the method comprising:
   comparing each of power supply voltages of the power supplies with the single output voltage; and
   setting a p-channel field-effect transistor corresponding to the power supply voltage to a selected one of conduction state and non-conduction state depending on a result of the comparing.

21. The method according to claim 20, wherein the setting to a selected state comprises:
   setting the corresponding p-channel field-effect transistor to the conduction state when the single output voltage is equal to or lower than the corresponding power supply voltage, and
   setting the corresponding p-channel field-effect transistor to the non-conduction state when the single output voltage is higher than the corresponding power supply voltage.

22. A control method of a power supply circuit using a plurality of power supplies to generate a single output voltage which is supplied to a load, the power supply circuit comprising a plurality of n-channel field-effect transistors provided for respective ones of the power supplies, each of the n-channel field-effect transistors connecting a corresponding power supply to the load, wherein a source electrode of the n-channel field-effect transistor corresponding to an anode of an inherent diode of the n-channel field-effect transistor is connected to the corresponding power supply and a drain electrode of the n-channel field-effect transistor corresponding to a cathode of the inherent diode is connected to the load, each of the n-channel field-effect transistors controlled by an operational amplifier having a positive signal input derived from a voltage at the drain electrode and a negative signal input derived from a voltage at the source electrode, the method comprising:
   comparing each of power supply voltages of the power supplies with the single output voltage; and
   setting an n-channel field-effect transistor corresponding to the power supply voltage to a selected one of conduction state and non-conduction state depending on a result of the comparing.

23. The method according to claim 22, wherein the setting to a selected state comprises:
   setting the corresponding n-channel field-effect transistor to the conduction state when the single output voltage is equal to or lower than the corresponding power supply voltage; and
   setting the corresponding n-channel field-effect transistor to the non-conduction state when the single output voltage is higher than the corresponding power supply voltage.

* * * * *